United States Patent [19]

Arai

[11] Patent Number: 5,304,801
[45] Date of Patent: Apr. 19, 1994

[54] ELECTRON MICROSCOPE

[75] Inventor: Yoshihiro Arai, Tokyo, Japan

[73] Assignee: JEOL Ltd., Tokyo, Japan

[21] Appl. No.: 972,176

[22] Filed: Nov. 4, 1992

[30] Foreign Application Priority Data

Nov. 14, 1991 [JP] Japan .................... 3-298776

[51] Int. Cl.$^5$ ............................ H01J 37/26
[52] U.S. Cl. ................................ 250/311
[58] Field of Search ........................ 250/311

[56] References Cited

U.S. PATENT DOCUMENTS 3,256,433  6/1966  Watanabe et al. ............. 250/311
3,629,575  12/1971  Rakels ......................... 250/49.5 A Primary Examiner—Jack I. Berman
Attorney, Agent, or Firm—Webb, Burden, Ziesenheim & Webb

[57] ABSTRACT

An electron microscope is disclosed which permits one to observe a high-contrast TEM image at a high-resolution. The electron microscope according to this invention comprises an objective lens OL which forms a first diffraction image $P_1$ at the back focal plane of the objective lens OL; a selected area diaphragm 12 located behind the objective lens OL; an objective minilens ML which is located between the objective lens OL and the selected area diaphragm 12, the minilens ML is excited in such a way that the minilens ML produces a second diffraction image $P_2$ at the position of the selected area diaphragm 12, while the object plane of the minilens being located at the position of the first diffraction image $P_1$; an intermediate lens $IL_1$ located behind said selected area diaphragm 12 and excited in such a way that the object plane of the intermediate lens $IL_1$ is located at the position of a TEM image produced by both said objective lens OL and minilens ML; and a lens system ($IL_2$, PL) which magnifies a TEM image produced by said intermediate lens $IL_1$ and projects the magnified TEM image onto a viewing screen 13.

1 Claim, 3 Drawing Sheets

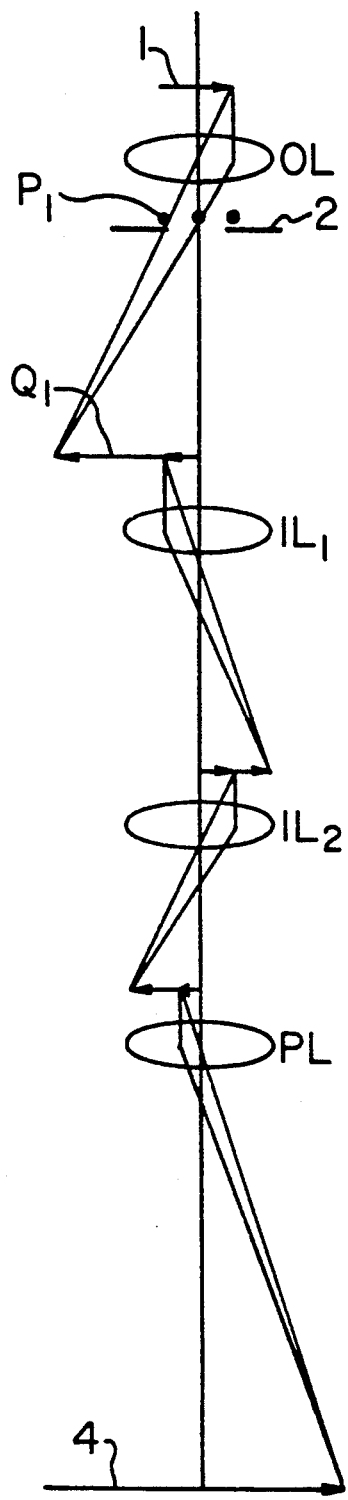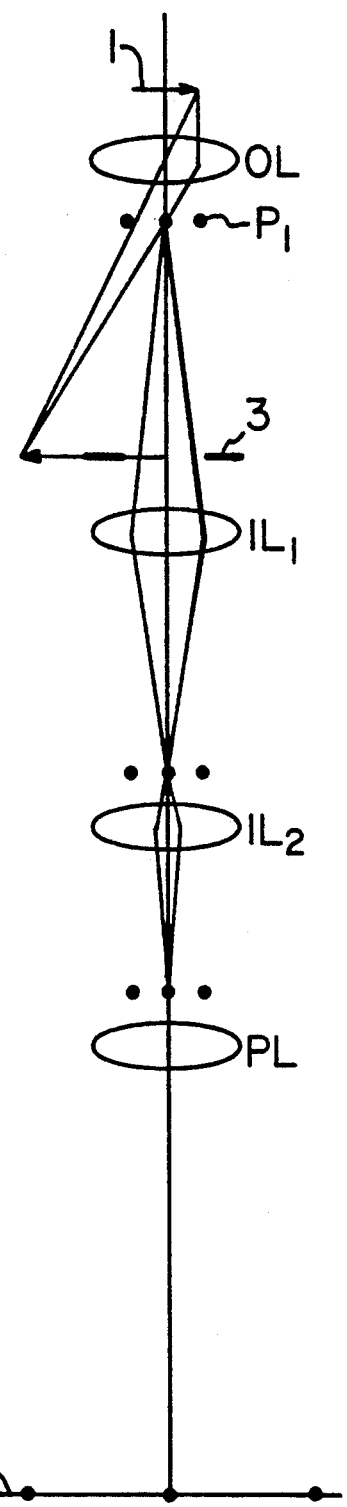
FIG. 3(a)
TEM
PRIOR ART
FIG. 3(b)
SAED
PRIOR ART

ELECTRON MICROSCOPE

FIELD OF THE INVENTION

The present invention relates to an electron microscope and, more particularly, to a transmission electron microscope adapted to observe high-contrast images at a wide field of view.

BACKGROUND OF THE INVENTION

Transmission electron microscopy has two modes or operation: (1) TEM image observation mode in which a TEM image that is a magnified image of a magnified specimen is observed; and (2) diffraction image observation mode in which a diffracted electron beam image focused at the back focal plane of the objective lens is projected onto the screen by the imaging lens system and observed. The latter mode is referred to as the selected area electron diffraction (SAED) method. The operations of the imaging lens systems in the TEM image observation mode and in the diffraction image observation mode are schematically illustrated in FIGS. 3(a) and 3(b). Shown in these figures are a specimen 1, an objective diaphragm 2, a selected area diaphragm 3, a screen 4, an objective lens OL, a first intermediate lens $IL_1$, a second intermediate lens $IL_2$ and a projector lens PL.

FIG. 3(a) shows the operation of the imaging lens system in the TEM image observation mode. In this mode, the objective diaphragm 2 is inserted to improve the contrast of the TEM image. The selected area diaphragm 3 is taken off. The electron beam is converged so as to obtain the desired brightness.

When the electron beam hits the specimen 1, a diffraction image $P_1$ is focused at the position of the objective diaphragm 2, i.e., at the back focal plane of the objective lens OL. Also, a TEM image $Q_1$ is focused at the position of the selected area diaphragm 3. The first intermediate lens $IL_1$ focuses the TEM image at a desired position while taking the TEM image $Q_1$ focused as the position of the selected area diaphragm 3 as an object plane. The TEM image is subsequently magnified by the second intermediate lens $IL_2$ and the projector lens PL and focused onto the screen 4. The arrows indicate the TEM images.

FIG. 3(b) illustrates the operation of the lenses in the selected area diffraction image observation mode. In this mode, the objective diaphragm 2 is taken off, and the select area diaphragm 3 is inserted. The electron beam illuminates a wide area of the specimen such that a collimated beam hits the specimen, whereby a clear diffraction image is obtained. The first intermediate lens $IL_1$ focuses the diffraction image at a given position while taking the diffraction image $P_1$ as an object plane, the image $P_1$ being focused at the position of the objective diaphragm 2. This diffraction image is then magnified by the second intermediate lens $IL_2$ and the projector lens PL and focused onto the screen 4.

The objective diaphragm has been indispensable when the TEM image is observed in the TEM image observation mode. However, in modern TEMs of quite high resolution, the gap between the pole pieces of the objective lens OL is as small as several millimeters. Therefore, it is difficult to insert the objective diaphragm between the pole pieces. Also, if the insertion of the objective diaphragm is possible, it is substantially impossible to bring the position of the objective diaphragm into the back focal plane of the objective lens. As a result, it is difficult to effectively cut scattered electron beams other than the desired diffracted electron beam to obtain a high-contrast and wide field of view TEM image. In order to obtain a high-contrast and wide field of view TEM image, a selected area diaphragm is used instead of an objective diaphragm. Such an electron microscope is disclosed in U.S. Pat. No. 3,629,575. In this electron microscope, the objective lens is very weakly excited so that the diffracted electron beam is focussed at the selected area diaphragm. However, in this electron microscope, since the objective lens is very weakly excited, the spherical aberration coefficient Cs and chromatic aberration coefficient Cc fairly increase. As a result, it is impossible to obtain high resolution image using such electron microscope.

When crystalline specimens such as a metal specimen is observed, it is necessary to frequently switch the mode of operation between the TEM image observation mode and the diffraction image observation mode. For example, in order to photograph one TEM image and one diffraction image having the same field of view as the TEM image, the mode is usually switched 20 or 30 times. As can be understood from the above description, each time the mode is switched, the objective diaphragm must be inserted or taken off and the selected area diaphragm must be inserted or taken off. In this way, the objective diaphragm and the selected area diaphragm must be operated. Hence, the mode switching has been quite cumbersome to perform.

SUMMARY OF THE INVENTION

It is a main object of the present invention to provide a high-resolution electron microscope which uses an objective lens having a quite narrow pole-piece gap but is capable of cutting unwanted scattering electron beams, thereby offering high-contrast and high-resolution TEM images with a wide field of view.

It is another object of the invention to provide an electron microscope permitting a human operator to easily switch the mode of operation between TEM image observation mode and diffraction image observation mode.

The above main object is achieved in accordance with the teachings of the invention by an electron microscope comprising: an objective lens with forms a first diffraction image at the back focal plane of the objective lens; a selected area diaphragm located behind said objective lens; an auxiliary lens which is located between said objective lens and said selected area diaphragm, said auxiliary lens being excited in such a way that said auxiliary lens produces a second diffraction image at the position of said selected area diaphragm, while the object plane of said auxiliary lens being located at the position of said first diffraction image; an intermediate lens located behind said selected area diaphragm and excited in such a way that the object plane of said intermediate lens is located at the position of a TEM image produced by both said objective lens and auxiliary lens; and a lens system which magnifies a TEM image produced by said intermediate lens and projects the magnified TEM image onto a detection screen.

The above objects are also achieved by an electron microscope comprising: an objective lens which forms a first diffraction image at the back focal plane of the objective lens; a selected area diaphragm located behind said objective lens; an auxiliary lens which is located between said objective lens and said selected area diaphragm, said auxiliary lens being excited in such a way that said auxiliary lens produces a second diffraction image at the position of said selected area diaphragm, while the object plane of said auxiliary lens being located at the position of said first diffraction image; an intermediate lens located behind said selected area diaphragm; a lens system located behind the intermediate lens; an intermediate lens-exciting means which, when the mode of operation of the electron microscope has been set to a TEM image observation mode, excites said intermediate lens in such a way that the object plane of said intermediate lens is located at a TEM image produced by both said objective lens and auxiliary lens and which, when the mode of operation of the microscope has been set to a diffraction image observation mode, excites said intermediate lens in such a way that the object plane of said intermediate lens is located at said second diffraction image; a lens system-exciting means by which, when the mode of operation has been set to the TEM image observation mode, excites said lens system is such a way that a TEM image produced by said intermediate lens is magnified and projected onto a detection screen by said lens system and which, when the mode of operation has been set to the diffraction image observation mode, excites said lens system in such a way that a diffraction image produced by said intermediate lens is magnified and projected onto the detection screen by said lens system.

Other objects and features of the invention will appear in the course of the description thereof which follows.

BRIEF DESCRIPTION OF THE DRAWINGS

FIGS. 3(a) and 3(b) are ray diagrams illustrating the operation of a prior electron microscope.

DETAILED DESCRIPTION OF THE INVENTION

Figure 1:
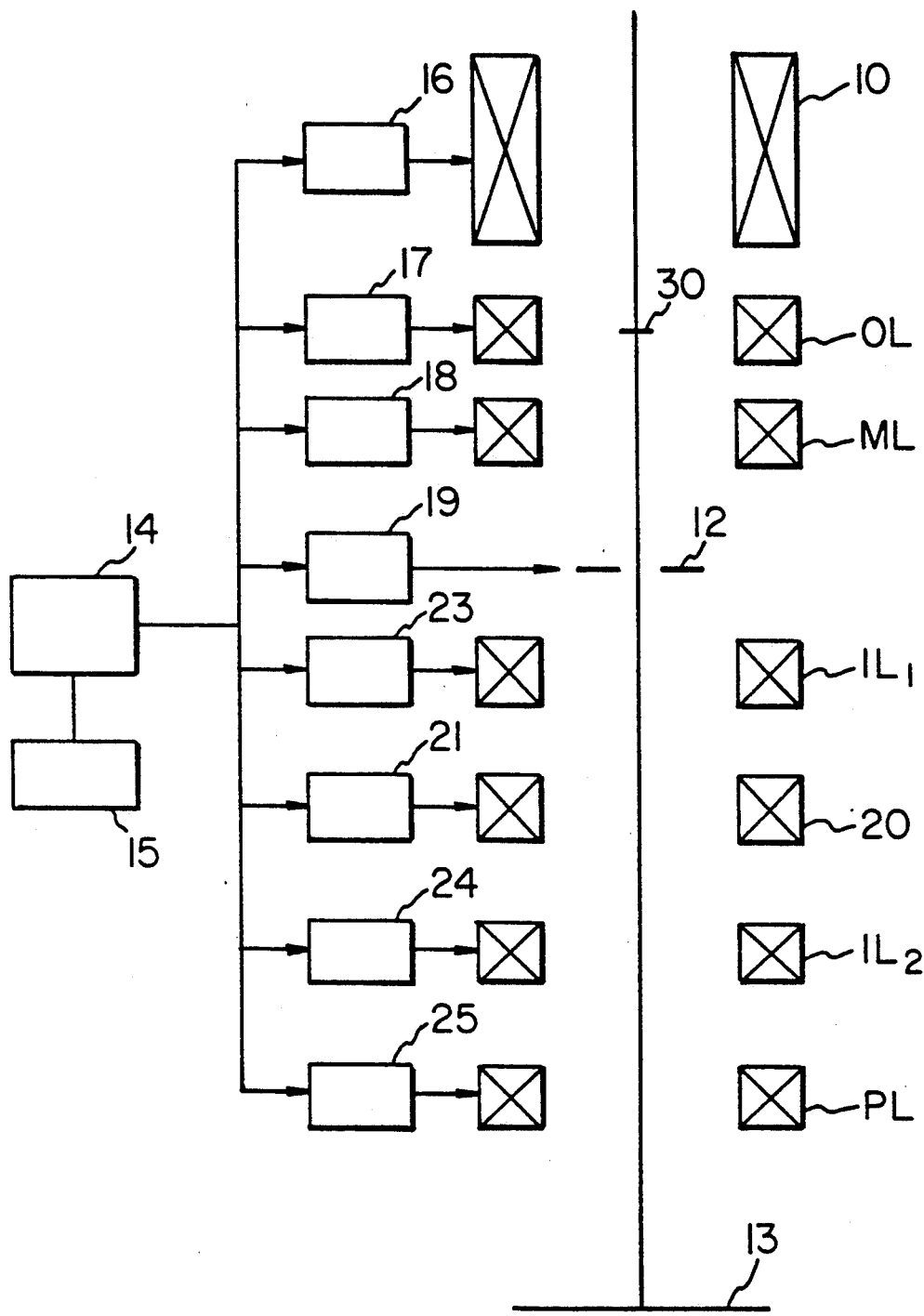
FIG. 1 is a block diagram of an electron microscope according to the invention.

Referring to FIG. 1, there is shown an electron microscope embodying the concept of the present invention. This microscope comprises an objective lens OL, a minilens ML, a first intermediate lens $IL_1$, a condenser lens system 10, a selected area diaphragm 12, a viewing screen 13, a control unit 14, a console 15 having a mode-setting switch, a condenser lens system driver (power supply) 16, a minilens driver 18, a selected area diaphragm driver 19, deflection coil 20, a deflection coil driver 21, an objective lens driver 22, and a first intermediate lens driver 23. Indicated by 30 is a specimen. The microscope further includes a second intermediate lens driver 24 for exciting a second intermediate lens $IL_2$ and a projector lens driver 25 for exciting a projector lens PL.

Figure 2A:
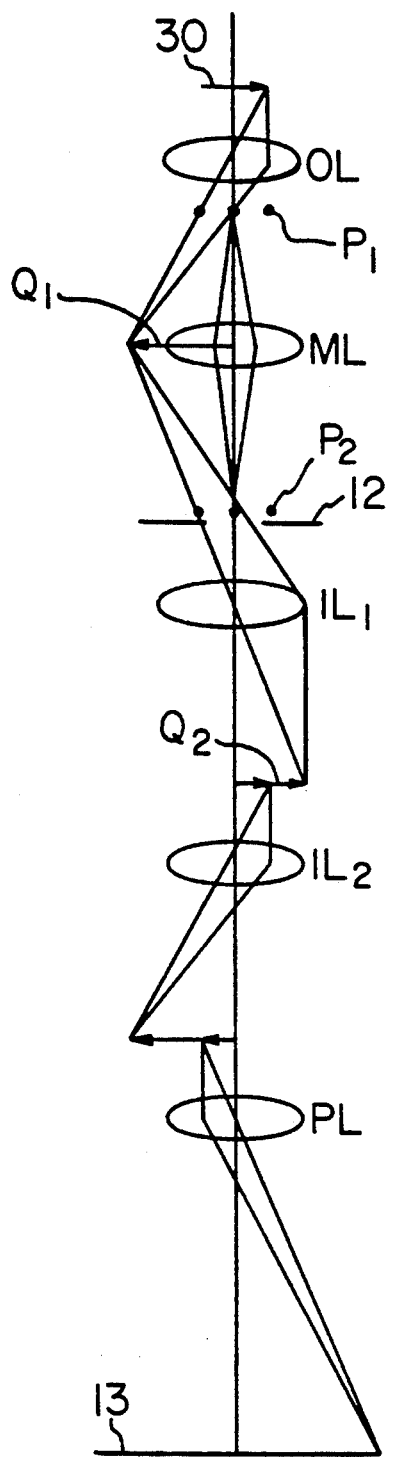
FIGS. 2(a) and 2(b) are ray diagrams illustrating the operations of the imaging lens system of the microscope shown in FIG. 1 in the TEM image observation mode and in the diffraction image observation mode, respectively.
Figure 2B:
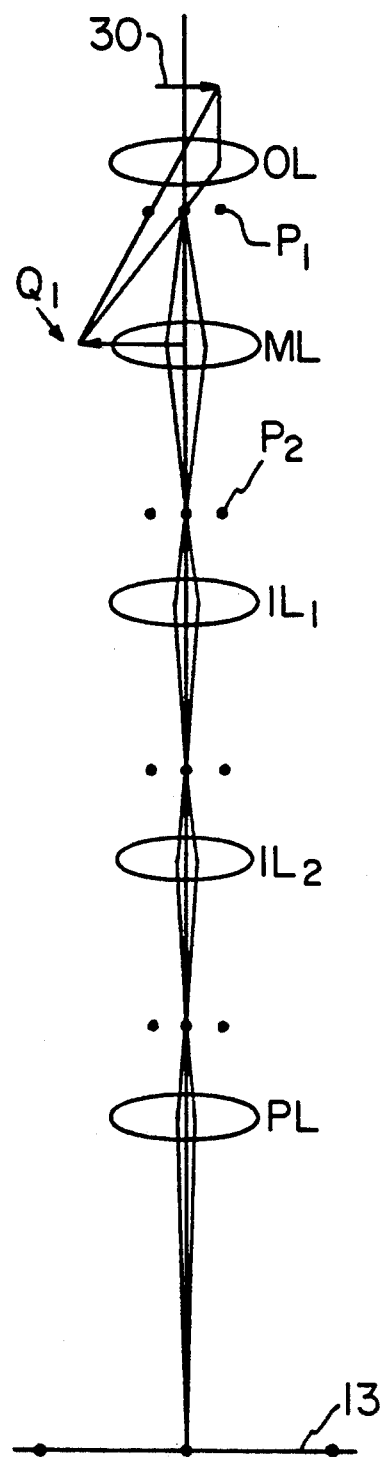

Referring to FIGS. 1 and 2, the objective lens OL produces a first diffraction image $P_1$ at the back focal plane of the objective lens. The selected area diaphragm 12 is located behind the objective lens OL. The minilens ML is located between the objective lens OL and the selected area diaphragm. Further, the location of the minilens ML is selected close to the image plane of the objective lens OL to suppress the off-axis aberration of the lens system starting with the minilens ML and ending with the projector lens PL. It is assumed that the principal plane of the minilens ML agrees with the image plane of the objective lens OL. According to the lens action of the objective lens OL and the minilens ML, a TEM image $Q_1$ is formed as shown in FIG. 2. A constant exciting current is kept supplied to the minilens ML to excite it in such a way that a second diffraction image $P_2$ is produced at the position of the selected area diaphragm 12 while locating the object plane of the minilens ML at the first diffraction image $P_1$. The first intermediate lens $IL_1$ is located behind the selected area diaphragm 12. In the TEM image observation mode, the first intermediate lens $IL_1$ is excited in such a way that the object plane of the first intermediate lens $IL_1$ is located at the position of the TEM image $Q_1$ and a TEM image produced by the first intermediate lens $IL_1$ is magnified and projected on the viewing screen 13 by the second intermediate lens $IL_2$ and projection lens PL. On the other hand, in the diffraction image observation mode, the first intermediate lens $IL_1$ is so excited that the position of the object plane of the first intermediate lens $IL_1$ is located at the second diffraction image $P_2$. A third diffraction image produced by the first intermediate lens $IL_1$ is magnified and projected onto the screen 13 by the second intermediate lens $IL_2$ and the projector lens PL.

The deflection coils 20 are disposed as blanking means which stop the electron beam from hitting the screen 13. The console 15 is used to switch the mode of operation between the TEM image observation mode and the diffraction image observation mode. The console 15 is equipped with appropriate switches such as buttons. The control unit 14 is composed of a microprocessor and peripheral devices.

In the operation of this electron microscope, the human operator controls the focusing lens driver 16 via the control unit 14 to observe a desired microscopic region or to irradiate only a desired region to be analyzed with the electron beam. Thus, the condenser lens system 10 converges the electron beam onto the desired region of the specimen 30. When the console 15 indicates the TEM image observation mode, the control unit 14 instructs the selected area diaphragm driver 19 to bring the selected area diaphragm 12 onto the optical axis. As a result, the selected area diaphragm 12 is brought onto the optical axis. The control unit 14 also orders the first intermediate lens driver 23 to excite such a way that the object plane of the first intermediate lens is located at the position of the TEM image $Q_1$. Depending on the magnification set by the operator, the control unit 14 causes the second intermediate lens driver 24 and the projector lens driver 25 to supply corresponding exciting currents to the second intermediate lens $IL_2$ and the projector lens PL, respectively. At this time, the control unit 14 causes the objective lens driver 22 to produce a given or predetermined objective lens current or an objective lens current which satisfies lens conditions established by the operator. The control unit 14 instructs the minilens driver 18 to supply the aforementioned given current. At this time, as shown in FIG. 2(a), the TEM image $Q_1$ formed at the image plane of the objective lens OL is focused as an image $Q_2$ at a given position by the first intermediate lens $IL_1$. This image $Q_2$ is magnified and projected onto the screen 13 by the second intermediate lens $IL_2$ and the projector lens PL mounted at the rear stage. At this time, the minilens ML focuses the diffraction image $P_1$ as an image $P_2$ at the position of the selected area diaphragm 12, the diffraction image $P_1$ being formed at the back focal plane of the objective lens. Therefore, the selected area diaphragm 12 cuts unwanted scattering rays. Consequently, with the high-resolution electron microscope where insertion of the selected area diaphragm is quite difficult because of a very narrow pole-piece gap of the objective lens OL, a high-contrast TEM image can be observed at a wide field of view.

When the console 15 has established the diffraction image observation mode, the following control operations are performed while the electron beam is kept focused by the condenser lens system 10. The control unit 14 orders the selected area diaphragm driver 19 to move the selected area diaphragm 12 off the optical axis. Also, the control unit 14 instructs the first intermediate lens driver 23 to produce such an exciting current that the position of the diffraction image $P_2$ is taken as an object plane of the first intermediate lens, the diffraction image $P_2$ being focused at the position of the selected area diaphragm by the minilens ML. Furthermore, the control unit 14 causes the second intermediate lens driver 24 and the projector lens driver 25 to produce such exciting currents that the camera length indicated by the console 15 is obtained.

In this way, the selected area diaphragm 12 is moved off the optical axis, and the aforementioned given exciting current is supplied to the first intermediate lens $IL_1$. At this time, the control unit 14 instructs the objective lens driver 22 to produce a given objective lens current, i.e., either a predetermined objective lens current or an objective lens current satisfying the lens conditions set by the operator. The control unit 14 causes the minilens driver 18 to produce the given exciting current, so that the indicated exciting currents are supplied to the minilens ML. As shown in FIG. 2($b$), in this mode, an image of the diffraction image $P_1$ formed at the back focal plane of the objective lens OL is formed as the second diffraction image $P_2$ at the position of the selected area diaphragm 12 by the minilens ML. In this mode, the first intermediate lens $IL_1$, the following stage of second intermediate lens $IL_2$, and the projector lens PL together cooperate to magnify and project the second diffraction image formed on the selected area diaphragm 12 onto the screen 13.

When the mode of operation is switched from the TEM image observation mode to the diffraction image observation mode, the control unit 14 performs the following control operations. The control unit 14 causes the deflection coil driver 21 to perform a blanking operation during the period between the instant at which switching of the mode of operation is indicated and the instant at which the first intermediate lens $IL_1$ and other lenses are completely excited in conformity with the indicated mode. In this manner, during the switching of the mode of operation, given exciting currents are fed to the deflection coils 20. During the switching period, therefore, the electron beam is deflected away from the screen 13. This prevents the image on the screen 13 from flickering during the mode switching. Similar control operations are carried out when the mode of operation is switched from the diffraction image observation mode to the TEM image observation mode.

While one preferred embodiment of the invention has been described, it is to be understood that the invention is not limited to this embodiment but rather various changes and modifications are possible. In the above-described embodiment, the mode is switched manually. The control unit 14 may automatically switch the mode of operation between the two modes at desired intervals of time. Also, in the above-described embodiment, the deflection coils are used as a means for blanking the electron beam. Instead, a member blocking the electron beam may be placed on the optical axis. Furthermore, in the above-described embodiment, an image is projected onto the fluorescent screen. The image may also be projected onto a screen which is taken by a pickup tube.

As can be seen from the description made thus far, the novel electron microscope equipped with a high-resolution objective lens having a narrow pole-piece gap into which a selected area diaphragm cannot be easily inserted can cut unwanted scattered electron rays by means of the selected area diaphragm. Therefore, a high-contrast TEM image can be observed at a high resolution.

Also in accordance with the present invention, when switching of the mode is indicated through the console, the mode can be easily switched between the TEM image observation mode and the diffraction image observation mode simply by moving the selected area diaphragm into or out of the optical axis without moving the objective stop.

As used in the specification and claims herein "behind" an element refers to a position along the electron optical axis on the side of the element furthest from the electron source.

Having thus described my invention with the detail and particularity required by the Patent Laws, what is claimed to be protected by Letters Patent is set forth in the following claims.

What is claimed is:

1. An electron microscope comprising:
    an objective lens which forms a first diffraction image at the back focal plane of the objective lens;
    a selected area diaphragm located behind said objective lens;
    auxiliary lens which is located between said objective lens and said selected area diaphragm, said auxiliary lens being excited in such a way that said auxiliary lens produces a second diffraction image at the position of said selected area diaphragm, the object plane of said auxiliary lens being located at the position of said first diffraction image;
    an intermediate lens located behind said selected area diaphragm;
    a lens system located behind the intermediate lens;
    an intermediate lens-exciting means which, when the mode of operation of the electron microscope has been set to a TEM image observation mode, excites said intermediate lens in such a way that the object plane of said intermediate lens is located at a TEM image produced by both said objective lens and auxiliary lens and which, when the mode of operation of the microscope has been set to a diffraction image observation mode, excites said intermediate lens in such a way that the object plane of said intermediate lens is located at said second diffraction image;
    a lens system-exciting means which, when the mode of operation has been set to the TEM image observation mode, excites said lens system in such a way that a TEM image produced by said intermediate lens is magnified and projected onto a detection screen by said lens system and which, when the mode of operation has been set to the diffraction image observation mode, excites said lens system in such a way that a diffraction image produced by said intermediate lens is magnified and projected onto the detection screen by said lens system.

* * * * *